(12) United States Patent
Salzman

(10) Patent No.: US 10,607,958 B2
(45) Date of Patent: Mar. 31, 2020

(54) FLIP CHIP BACKSIDE DIE GROUNDING TECHNIQUES

(71) Applicant: Texas Instruments Incorporated, Dallas, TX (US)

(72) Inventor: James Fred Salzman, Anna, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/249,423

(22) Filed: Aug. 28, 2016

(65) Prior Publication Data

US 2017/0062376 A1 Mar. 2, 2017

Related U.S. Application Data

(60) Provisional application No. 62/211,492, filed on Aug. 28, 2015.

(51) Int. Cl.
*H01L 23/367* (2006.01)
*H01L 23/00* (2006.01)
(Continued)

(52) U.S. Cl.
CPC .......... *H01L 24/73* (2013.01); *H01L 21/4853* (2013.01); *H01L 23/3121* (2013.01); *H01L 23/3185* (2013.01); *H01L 23/49838* (2013.01); *H01L 23/552* (2013.01); *H01L 27/11807* (2013.01); *H01L 21/563* (2013.01);
(Continued)

(58) Field of Classification Search
CPC ............. H01L 21/4803; H01L 21/4871; H01L 21/4882; H01L 23/3672; H01L 23/3677
See application file for complete search history.

(56) References Cited

U.S. PATENT DOCUMENTS 5,311,059 A 5/1994 Banerji et al.
5,371,404 A * 12/1994 Juskey ............... H01L 23/04
257/659

(Continued)

OTHER PUBLICATIONS

U.S. Appl. No. 15/249,424, filed Aug. 28, 2016.
(Continued)

*Primary Examiner* — Bitew A Dinke
(74) *Attorney, Agent, or Firm* — Rose Alyssa Keagy; Charles A. Brill; Frank D. Cimino

(57) ABSTRACT

An integrated circuit is attached to a chip carrier in a flip chip configuration. An electrically conductive conformal layer is disposed on a back surface of the substrate of the integrated circuit. The electrically conductive conformal layer contacts the semiconductor material in the substrate and extending onto, and contacting, a substrate lead of the chip carrier. The substrate lead of the chip carrier is electrically coupled to a substrate bond pad of the integrated circuit. The substrate bond pad is electrically coupled through an interconnect region of the integrated circuit to the substrate of the integrated circuit. A component is attached to the chip carrier and covered with an electrically insulating material. The electrically conductive conformal layer also extends at least partially over the electrically insulating material on the component. The electrically conductive conformal layer is electrically isolated from the component by the electrically insulating material on the component.

10 Claims, 6 Drawing Sheets

(51) Int. Cl.
    *H01L 27/118*     (2006.01)
    *H01L 23/498*     (2006.01)
    *H01L 23/31*     (2006.01)
    *H01L 21/48*     (2006.01)
    *H01L 23/552*     (2006.01)
    *H01L 21/56*     (2006.01)

(52) U.S. Cl.
    CPC ....... *H01L 24/16* (2013.01); *H01L 2027/1189* (2013.01); *H01L 2224/16227* (2013.01); *H01L 2224/2919* (2013.01); *H01L 2224/32225* (2013.01); *H01L 2224/73204* (2013.01); *H01L 2224/73253* (2013.01); *H01L 2224/92125* (2013.01); *H01L 2924/19041* (2013.01); *H01L 2924/19105* (2013.01)

(56) References Cited

U.S. PATENT DOCUMENTS

| | | | |
|---|---|---|---|
| 6,713,878 | B2 | 3/2004 | Goetschalckx |
| 8,008,753 | B1 | 8/2011 | Bolognia |
| 8,648,448 | B2 | 2/2014 | Pagaila et al. |
| 9,117,648 | B2 | 8/2015 | Pothoven et al. |
| 9,281,232 | B2 | 3/2016 | Salzman |
| 9,281,245 | B2 | 3/2016 | Salzman et al. |
| 2002/0076851 | A1* | 6/2002 | Eden ............... H01L 23/4824 438/106 |
| 2005/0180113 | A1* | 8/2005 | Shirakami ............ H01L 23/373 361/704 |
| 2006/0055432 | A1* | 3/2006 | Shimokawa .......... H01L 21/565 327/5 |
| 2006/0148241 | A1* | 7/2006 | Brody ................. C23C 14/042 438/637 |
| 2007/0045829 | A1 | 3/2007 | Jeong et al. |
| 2010/0084761 | A1* | 4/2010 | Shinagawa ......... H01L 23/3128 257/706 |
| 2010/0157566 | A1 | 6/2010 | Bogursky et al. |
| 2012/0241941 | A1* | 9/2012 | Kim ..................... H01L 23/367 257/712 |
| 2013/0300004 | A1* | 11/2013 | Choi ..................... H01L 24/97 257/796 |
| 2015/0066124 | A1 | 3/2015 | Stevenson et al. |
| 2015/0140696 | A1* | 5/2015 | Ahmed .................. H01L 21/22 438/17 |
| 2015/0187675 | A1* | 7/2015 | Tang ..................... H01L 23/367 257/712 |
| 2015/0279761 | A1* | 10/2015 | Bet-Shliemoun ....... H01L 23/42 257/714 |
| 2016/0093552 | A1* | 3/2016 | Venugopal .......... H01L 23/3675 257/29 |
| 2017/0062377 | A1* | 3/2017 | Salzman ................ H01L 24/73 |

OTHER PUBLICATIONS

Galarowicz, "Instrumentation Requirements for Tree Effects Data Collection at the Naval Postgraduate School Flash X-Ray Facility", Jun. 1990, Naval Postgraduate School.

* cited by examiner

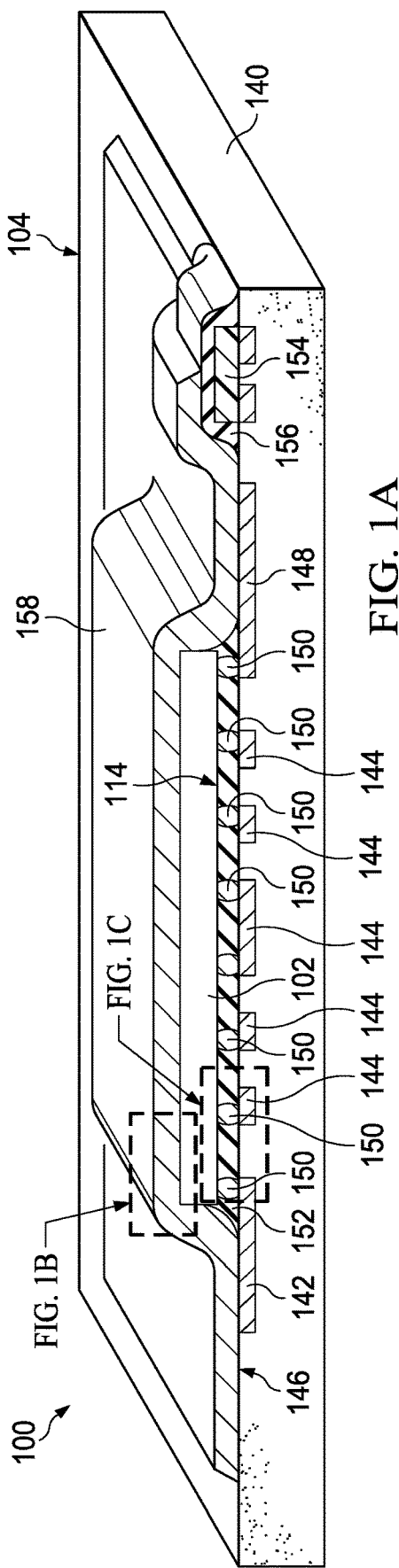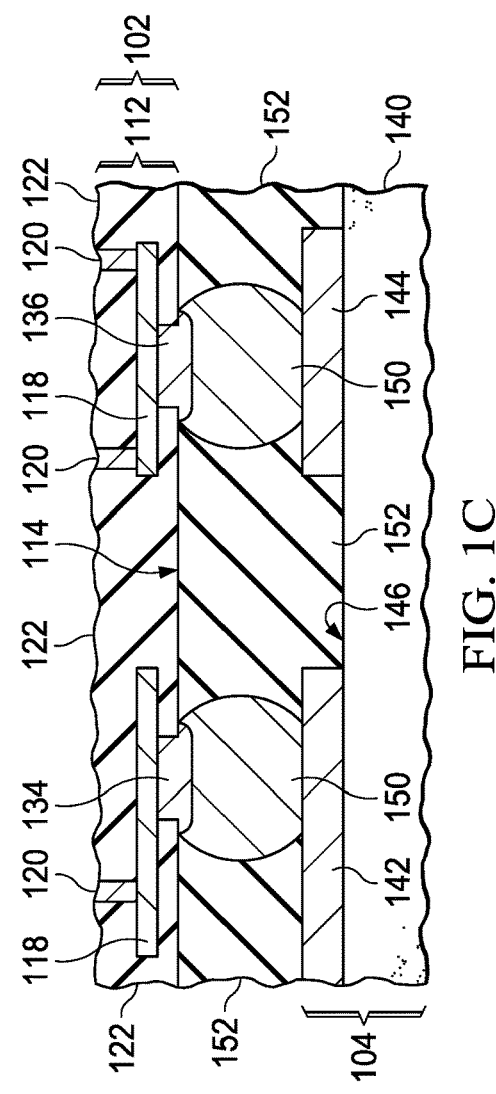

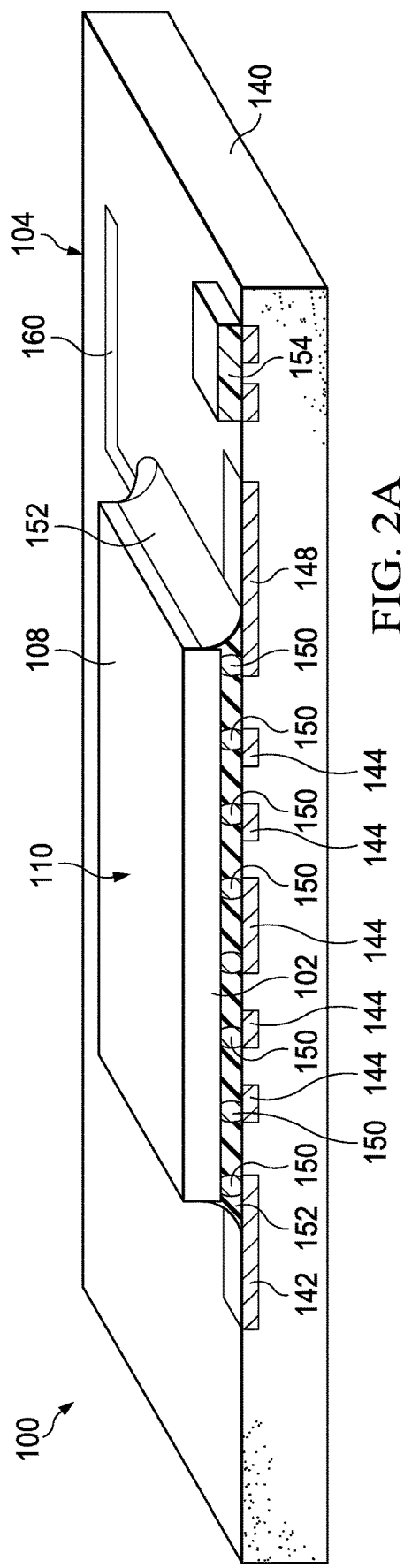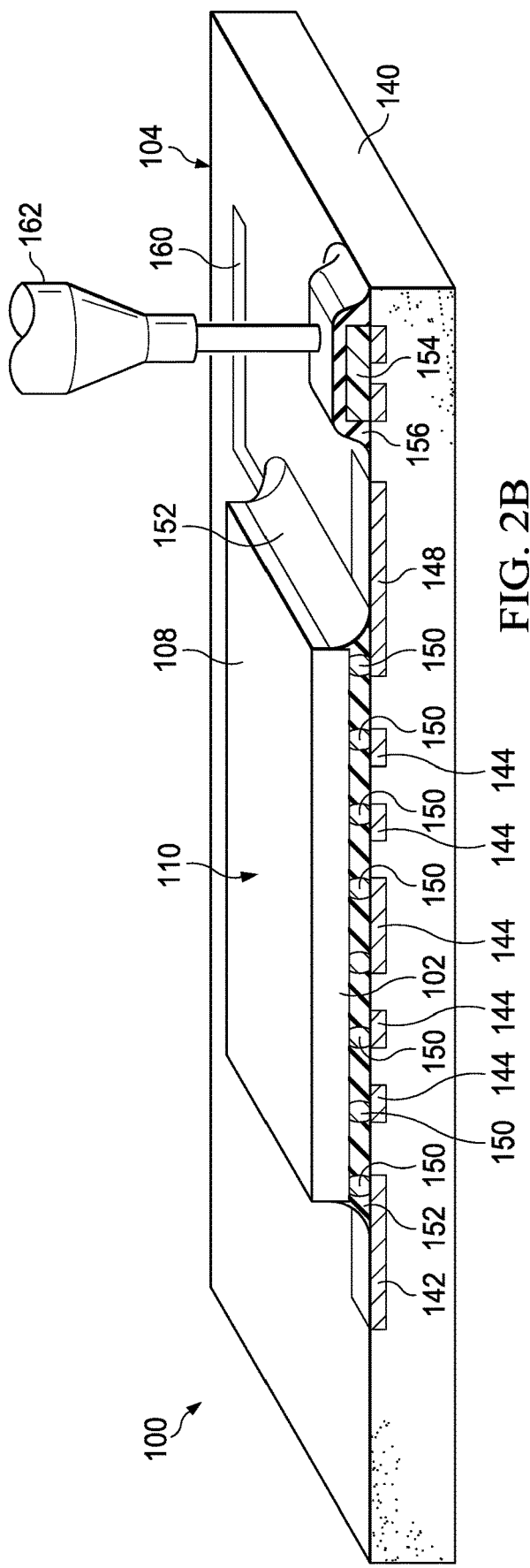

FLIP CHIP BACKSIDE DIE GROUNDING TECHNIQUES

CROSS-REFERENCE TO RELATED APPLICATION

This application claims the benefit of priority under 35 U.S.C. § 119(e) of U.S. Provisional Application 62/211,492, filed Aug. 28, 2015, which is hereby incorporated by reference in its entirety.

FIELD OF THE INVENTION

This invention relates to the field of semiconductor devices. More particularly, this invention relates to grounding structures of semiconductor devices.

BACKGROUND OF THE INVENTION

Integrated circuits with logic gates may be susceptible to latchup that is induced by generation of electron-hole pairs from high energy ionized particles, for example as encountered in space-based applications. The source, drain, and well regions of the logic gates can constitute parasitic bipolar junction transistors which combine to constitute a silicon controlled rectifier (SCR) in the substrate of the integrated circuit. Current from the electron-hole pairs flows through a lateral resistance between the parasitic bipolar junction transistors and turns on the SCR, inducing latchup. Wire bonded integrated circuits commonly have electrically conductive material, such as conductive adhesive or solder, on the back surface of the substrate to reduce the lateral resistance, which improves resistance to latchup. Bump bonded integrated circuits, also known as flip chips, are typically more prone to latchup. Reducing the resistance of the substrate of the integrated circuits during manufacture in a fab is not compatible with typical digital integrated circuit manufacturing and assembly processes, and undesirably increases costs.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes an integrated circuit attached to a chip carrier. The integrated circuit includes a substrate with semiconductor material, and an interconnect region on the substrate. The semiconductor material extends to a back surface of the integrated circuit, and the interconnect region extends to a front surface of the integrated circuit. The integrated circuit includes a plurality of n-channel metal oxide semiconductor (NMOS) transistors and a plurality of p-channel metal oxide semiconductor (PMOS) transistors. Bond pads are disposed at the front surface of the integrated circuit. A plurality of the bond pads are electrically coupled through the interconnect region to the NMOS transistors and PMOS transistors. A substrate bond pad of the bond pads is electrically coupled through the interconnect region to the semiconductor material in the substrate of the integrated circuit.

The chip carrier includes leads at a front surface of the chip carrier. The leads include a substrate lead. A component is mounted on the front surface of the chip carrier. An electrically insulating material is disposed on the component.

The front surface of the integrated circuit is facing the front surface of the chip carrier, referred to as a flip chip configuration. The bond pads of the integrated circuit are electrically coupled to the leads of the chip carrier. The substrate lead of the chip carrier is electrically coupled to the substrate bond pad of the integrated circuit. An underfill material, which is electrically insulating, is disposed around a perimeter of the integrated circuit, between the integrated circuit and the chip carrier. The substrate lead extends on the front surface of the chip carrier past the underfill material.

An electrically conductive conformal layer is disposed on the back surface of the integrated circuit, making electrical contact with the semiconductor material in the substrate. The electrically conductive conformal layer extends over the underfill material and onto the substrate lead of the chip carrier, making electrical connection to the substrate lead. The electrically conductive conformal layer also extends at least partially over the electrically insulating material on the component. The electrically conductive conformal layer is electrically isolated from the component by the electrically insulating material on the component.

The semiconductor device is formed by disposing the electrically insulating material on the component. Subsequently, a shadow mask is placed proximate to the integrated circuit on the chip carrier; the shadow mask has an aperture which exposes an area for the electrically conductive conformal layer, including the back surface of the integrated circuit. The electrically conductive conformal layer is formed by a vapor phase transport process of electrically conductive material through the aperture of the shadow mask onto the back surface of the substrate, the substrate lead of the chip carrier and the electrically insulating material on the component.

BRIEF DESCRIPTION OF THE VIEWS OF THE DRAWINGS

FIG. 1A through FIG. 1C are cross sections of an example semiconductor device.

FIG. 2A through FIG. 2D depict the semiconductor device of FIG. 1A through FIG. 1C in successive stages of an example method of formation.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following co-pending patent application is related and hereby incorporated by reference: U.S. patent application Ser. No. 15/249,424. With its mention in this section, this patent application is not admitted to be prior art with respect to the present invention.

Figure 1B:
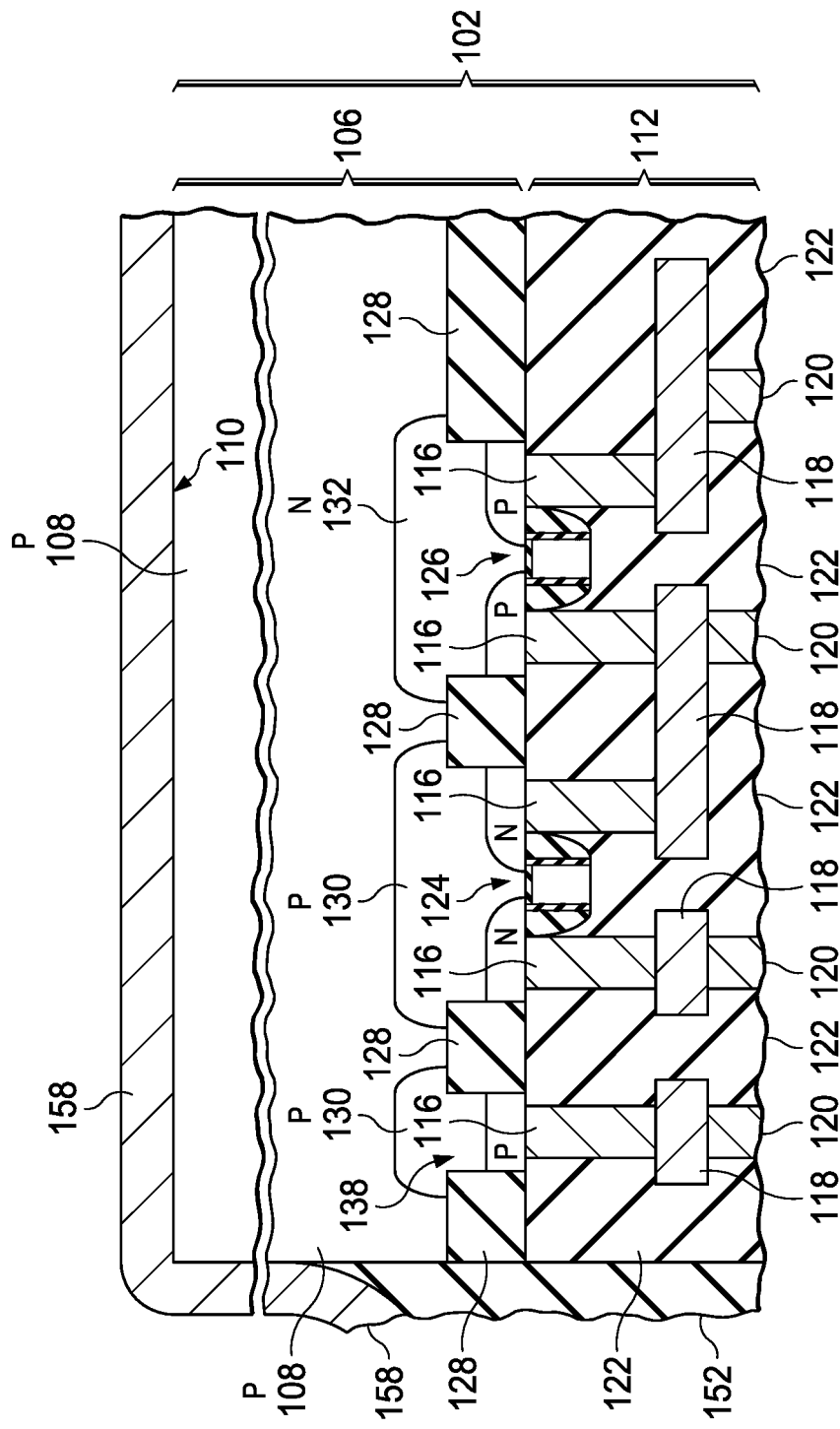

FIG. 1A through FIG. 1C are cross sections of an example semiconductor device. The semiconductor device 100 includes an integrated circuit 102 attached to a chip carrier 104. The integrated circuit 102 includes a substrate 106 having a semiconductor material 108 such as p-type silicon, as indicated in FIG. 1B. Other semiconductor materials and other conductivity types for the semiconductor material 108 are within the scope of the instant example. The semiconductor material 108 extends to a back surface 110 of the integrated circuit 102.

The integrated circuit 102 further includes an interconnect region 112 on the substrate 106. The interconnect region 112 extends to a front surface 114 of the integrated circuit 102. The interconnect region 112 includes interconnects, for example contacts 116, metal lines 118, and vias 120. The interconnect region 112 includes dielectric material 122 around the contacts 116, metal lines 118, and vias 120. The dielectric material 122 may include a plurality of layers, for example a pre-metal dielectric (PMD) layer contacting the substrate 106, intra-metal dielectric (IMD) layers laterally separating the metal lines 118, intra-level dielectric (ILD) layers vertically separating the metal lines 118, and one or more protective overcoat layers between a top level of the metal lines 118 and the front surface 114 of the integrated circuit 102.

A plurality of NMOS transistors 124 and PMOS transistors 126 are disposed in the integrated circuit 102, possibly separated by field oxide 128. The field oxide 128 may have a shallow trench isolation (STI) structure as depicted in FIG. 1B, or may have a local oxidation of silicon (LOCOS) structure. The NMOS transistors 124 may be disposed in p-type wells 130 to provide desired performance parameters such as threshold voltage for the NMOS transistors 124. The PMOS transistors 126 may be disposed in n-type wells 132 to provide desired performance parameters for the PMOS transistors 126. The NMOS transistors 124 and the PMOS transistors 126 may be parts of logic gates or memory cells. The integrated circuit 102 may also contain bipolar junction transistors, junction field effect transistors and/or other active components.

A substrate bond pad 134 and a plurality of other bond pads 136 are distributed across the front surface 114. The bond pads 134 and 136 may be, for example plated bump bond pads as indicated in FIG. 1C. The bond pads 134 and 136 are electrically coupled to the metal lines 118 and/or the vias 120 possibly directly as indicated in FIG. 1C, or possibly through a redistribution layer (RDL) with metal lines connecting input/output pads at a periphery of the integrated circuit 102 to the bond pads 134 and 136. The substrate bond pad 134 is electrically coupled through the metal lines 118, the vias 120, and the contacts 116 to the semiconductor material 108 of the substrate 106, for example through a substrate tap 138. The other bond pads 136 are electrically coupled through the metal lines 118, the vias 120, and the contacts 116 to components of the integrated circuit 102.

The chip carrier 104 includes a base 140 of electrically insulating material such as ceramic or organic resin. The chip carrier 104 has a substrate lead 142 and other leads 144 of electrically conductive material on a front surface 146 of the base 140. The leads 142 and 144 may include, for example, copper, nickel, palladium, molybdenum, and/or gold. The substrate lead 142 is electrically coupled to the semiconductor material 108 of the substrate 106 of the integrated circuit 102. The substrate lead 142 extends past the integrated circuit 102. In the instant example, the chip carrier 104 may include a second substrate lead 148 which is similarly electrically coupled to the semiconductor material 108 of the substrate 106 of the integrated circuit 102.

The integrated circuit 102 is attached to the chip carrier 104 in a flip chip configuration, wherein the front surface 114 of the integrated circuit 102 is disposed facing the front surface 146 of the chip carrier 104. The leads 142, 144 and 148 of the chip carrier 104 are electrically coupled to the bond pads 134 and 136 of the integrated circuit 102, for example by bump bonds 150. The bump bonds 150 may include indium, tin, bismuth or other metals. Other structures for providing electrical coupling between the leads 142, 144 and 148, and the bond pads 134 and 136, with the front surface 114 of the integrated circuit 102 facing the front surface 146 of the chip carrier 104, for example anisotropic conductive attachment structures, are within the scope of the instant example. The substrate lead 142 of the chip carrier 104 is electrically coupled to the substrate bond pad 134, as shown in FIG. 1C. The second substrate lead 148, if present, is electrically coupled to through a second substrate bond pad, not shown, of the integrated circuit 102, to the semiconductor material 108 of the substrate 106.

An underfill material 152 of electrically insulating material is disposed between the front surface 114 of the integrated circuit 102 and the front surface 146 of the chip carrier 104, extending to a perimeter of the integrated circuit 102. The underfill material 152 may include, for example, epoxy, possibly with a particulate filler such as silica.

A component 154, for example a capacitor, is attached to the front surface 146 of the chip carrier 104. An electrically insulating material 156 at least partially covers the component 154. The electrically insulating material 156 may include, for example, epoxy or silicone.

An electrically conductive conformal layer 158 is disposed on the back surface 110 of the integrated circuit 102, making electrical contact with the semiconductor material 108 in the substrate 106. The electrically conductive conformal layer 158 extends over the underfill material 152 and onto the substrate lead 142 of the chip carrier 104, making electrical connection to the substrate lead 142, and to the second substrate lead 148 if present. The electrically conductive conformal layer 158 has a sheet resistance less than 0.1 ohms/square. The electrically conductive conformal layer 158 may include, for example, aluminum or gold, possibly on an adhesion layer comprising titanium. The electrically conductive conformal layer 158 also extends at least partially over the electrically insulating material 156 on the component 154 attached to the chip carrier 104. The electrically conductive conformal layer 158 is electrically isolated from the component 154 by the electrically insulating material 156 on the component 154. The electrically conductive conformal layer 158 provides a low resistance shunt across the semiconductor material 108 of the substrate 106 which is electrically connected to the semiconductor material 108 through the substrate tap 138. This low resistance shunt across the semiconductor material 108 may advantageously reduce incidences of latchup during operation of the integrated circuit 102. The electrically conductive conformal layer 158 may be particularly advantageous for manifestations of the instant example in which the semiconductor material 108 at the back surface 110 is p-type silicon, as p-type silicon has a higher resistivity than n-type silicon for a comparable dopant density, making the integrated circuit 102 with p-type silicon more susceptible to latchup.

Figure 2C:
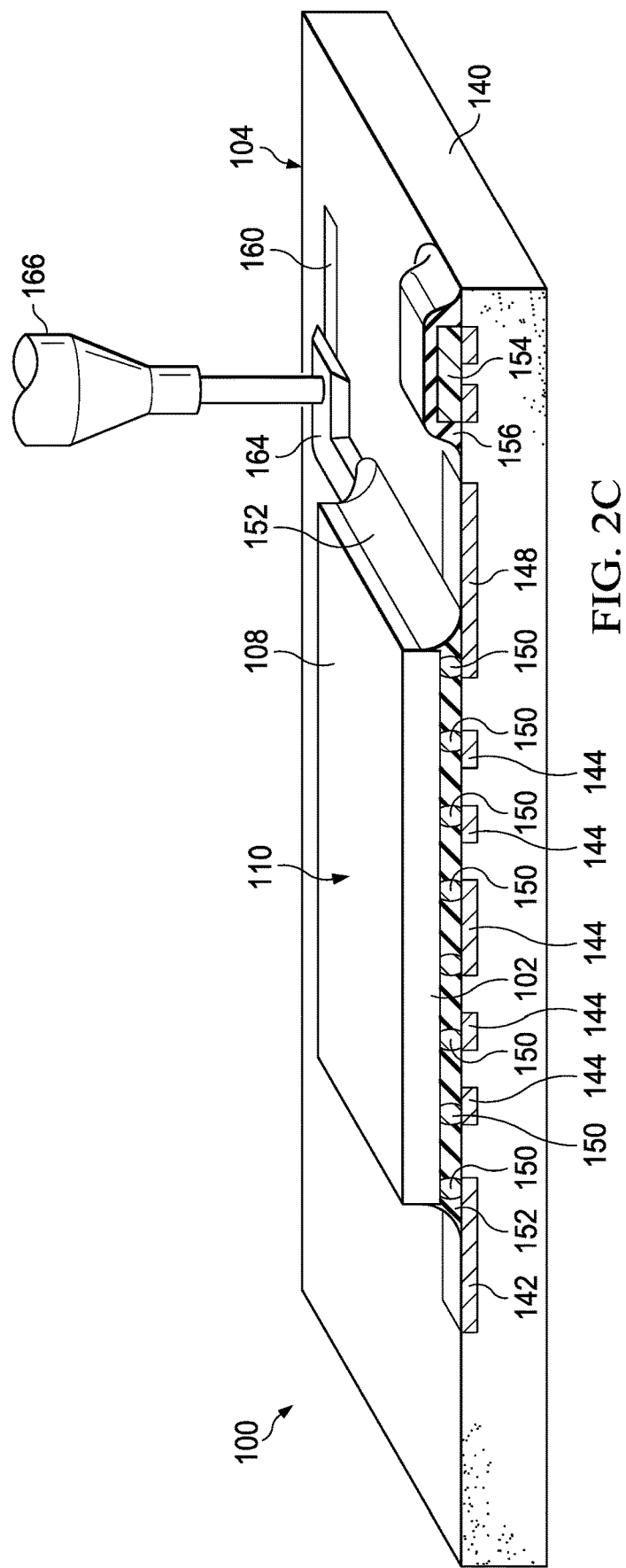

FIG. 2A through FIG. 2D depict the semiconductor device of FIG. 1A through FIG. 1C in successive stages of an example method of formation. Referring to FIG. 2A, the semiconductor device 100 has the integrated circuit 102 attached to the chip carrier 104 as described in reference to FIG. 1A through FIG. 1C. The substrate lead 142 and the second substrate lead 148 extend past the underfill material 152. The chip carrier 104 may include a non-substrate lead 160 which extends past the underfill material 152. The semiconductor material 108 at the back surface 110 of the integrated circuit 102 is exposed at this stage. The component 154 attached to the chip carrier 104 is not covered with the electrically insulating material 156 of FIG. 1A at this stage.

Referring to FIG. 2B, the electrically insulating material 156 is formed over the component 154. The electrically insulating material 156 may be formed, for example, by dispensing an organic resin such as epoxy from a dispensing apparatus 162 as indicated schematically in FIG. 2B, followed by a cure process. The cure process may include a thermal cycle and/or an exposure to ultraviolet (UV) light. Other methods of forming the electrically insulating material 156 over the component 154 are within the scope of the instant example.

Referring to FIG. 2C, a lead electrically insulating material 164 may be formed over the non-substrate lead 160. The lead electrically insulating material 164 may be an organic resin similar to the electrically insulating material 156 over the component 154, and may be formed by a similar process, such as an alternate dispensing apparatus 166. In one version of the instant example, the alternate dispensing apparatus 166 may be the dispensing apparatus 162 of FIG. 2B for forming the electrically insulating material 156 over the component 154, so that the lead electrically insulating material 164 has a same composition as the electrically insulating material 156. The lead electrically insulating material 164 may be cured concurrently with the electrically insulating material 156.

During fabrication of the integrated circuit 102, dielectric layers such as silicon dioxide and silicon nitride may be formed on a back surface of a wafer containing the integrated circuit 102, for example by furnace thin film processes. These dielectric layers may be removed before the integrated circuit 102 is singulated from the wafer, or may be removed after the integrated circuit 102 is attached to the chip carrier 104. The dielectric layers may be removed, for example, by lapping, backside grinding, etching, or sandblasting. Removing the dielectric layers is necessary to provide a desired electrical connection between the semiconductor material 108 and the subsequently formed electrically conductive conformal layer 158 of FIG. 1A.

Figure 2D:
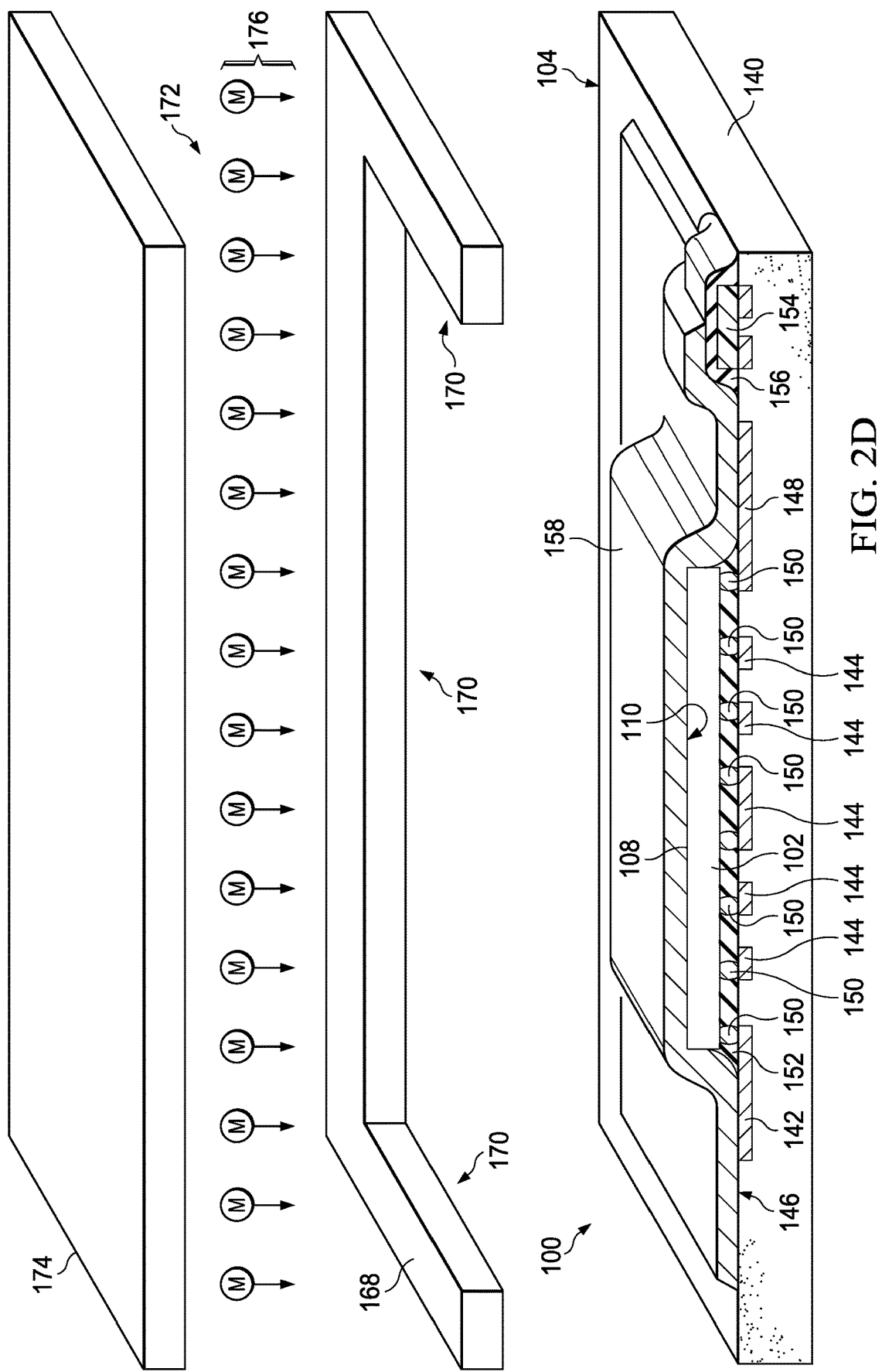

Referring to FIG. 2D, the semiconductor device 100 is positioned proximate to a shadow mask 168 having an aperture 170 aligned to an area for the subsequently formed electrically conductive conformal layer 158. The semiconductor device 100 and shadow mask 168 are placed in a sputter chamber 172 with a sputter target 174 disposed on an opposite side of the shadow mask 168 from the semiconductor device 100. The sputter target 174 includes electrically conductive material, for example aluminum, for the electrically conductive conformal layer 158. A sputter process is performed which sputters conductive material 176 from the sputter target 174 through the aperture 170 in the shadow mask 168 onto the semiconductor device 100 to form the electrically conductive conformal layer 158. Forming the electrically conductive conformal layer 158 may involve two sputter processes, similar to that described in reference to FIG. 2D: a first sputter process forms an adhesion layer and a second sputter process which forms a main metal layer with a desired sheet resistance. The adhesion layer may include, for example, titanium, and may be, for example, 5 nanometers to 50 nanometers thick. The main metal layer may include, for example, aluminum or copper, and may be, for example, 200 nanometers to 5 microns thick. Forming the electrically conductive conformal layer 158 by a sputter process may advantageously enable an assembly facility to form the electrically conductive conformal layer 158 independently of the facility which formed the integrated circuit 102. Forming the electrically conductive conformal layer 158 by the sputter process may provide improved adhesion compared to other methods.

Figure 3:
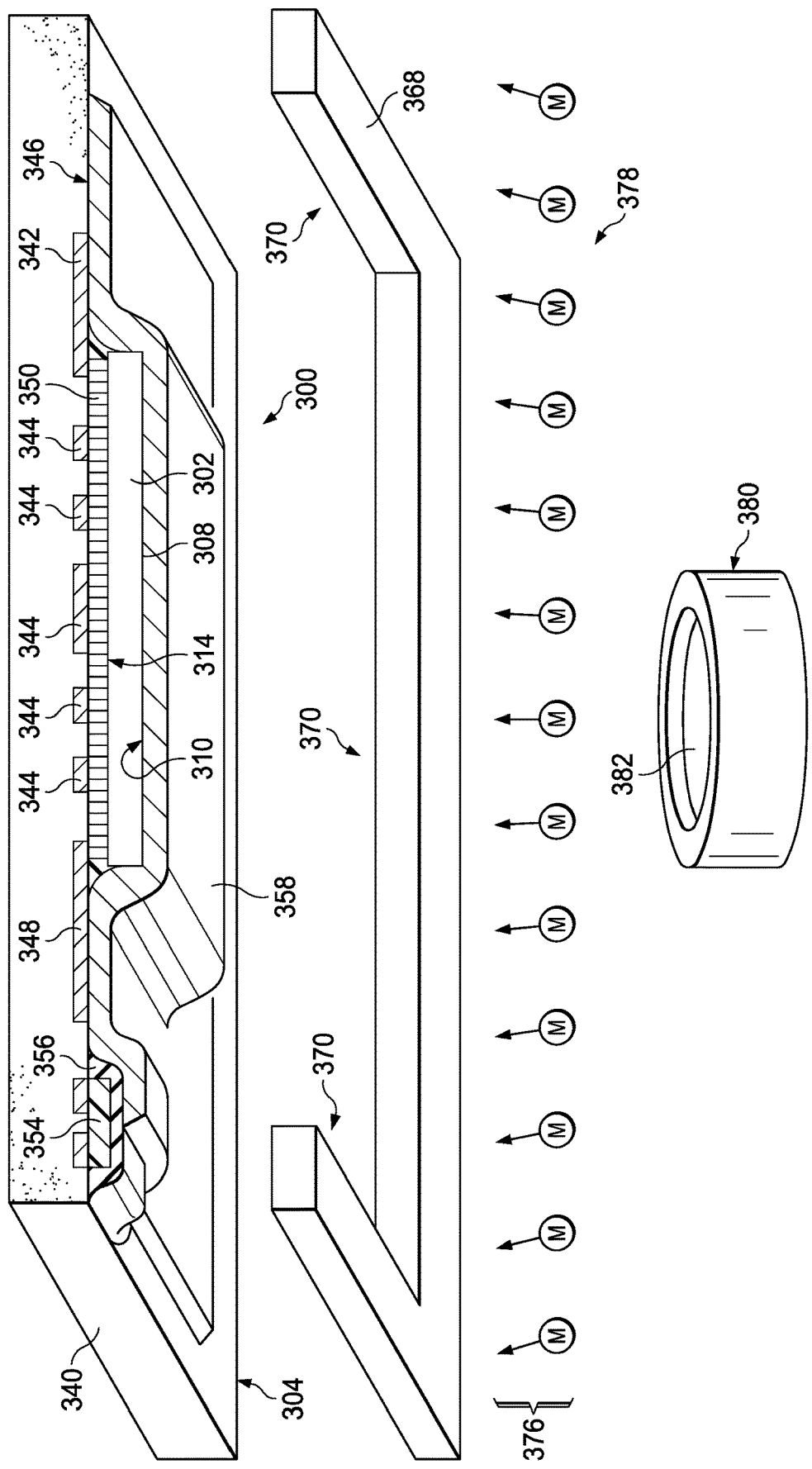
FIG. 3 depicts an alternate method of forming the electrically conductive conformal layer on another example semiconductor device.

FIG. 3 depicts an alternate method of forming the electrically conductive conformal layer on another example semiconductor device. The semiconductor device 300 includes an integrated circuit 302 attached to a chip carrier 304 in a flip chip configuration. The integrated circuit 302 includes a substrate having a semiconductor material 308 extending to a back surface 310 of the integrated circuit 302. The integrated circuit 302 further includes an interconnect region on the substrate, for example as described in reference to FIG. 1A through FIG. 1C. The interconnect region extends to a front surface 314 of the integrated circuit 302. A plurality of NMOS transistors and PMOS transistors are disposed as components of circuits in the integrated circuit 302. A substrate bond pad and a plurality of other bond pads are distributed across the front surface 314 of the integrated circuit 302. The substrate bond pad is electrically coupled through the interconnect region to the semiconductor material 308.

The chip carrier 304 includes a base 340 of electrically insulating material. The chip carrier 304 has a substrate lead 342 and other leads 344 of electrically conductive material on a front surface 346 of the base 340. The substrate lead 342 is electrically coupled to the semiconductor material 308 of the integrated circuit 302 through the substrate bond pad of the integrated circuit 302. The substrate lead 342 extends past the integrated circuit 302. In the instant example, the chip carrier 304 may include a second substrate lead 348 which is similarly electrically coupled to the semiconductor material 308 of the integrated circuit 302 through another substrate bond pad.

The integrated circuit 302 is attached to the chip carrier 304 in a flip chip configuration, wherein the front surface 314 of the integrated circuit 302 is disposed facing the front surface 346 of the chip carrier 304. The leads 342, 344 and 348 of the chip carrier 304 are electrically coupled to the bond pads of the integrated circuit 302, for example by an anisotropic conductor 350 such as an anisotropic conductive tape or an anisotropic conductive adhesive. Other structures for providing electrical coupling between the leads 342, 344 and 348, and the bond pads, such as bump bonds, are within the scope of the instant example. An underfill material of electrically insulating material may optionally be disposed between the front surface 314 of the integrated circuit 302 and the front surface 346 of the chip carrier 304, extending to a perimeter of the integrated circuit 302.

A component 354, for example a capacitor, is attached to the front surface 346 of the chip carrier 304. An electrically insulating material 356 at least partially covers the component 354. The electrically insulating material 356 may include, for example, epoxy or silicone.

The semiconductor device 300 is positioned proximate to a shadow mask 368 having an aperture 370 aligned to an area for the subsequently formed electrically conductive conformal layer 358. The shadow mask 368 of the instant example may be substantially identical to the shadow mask 168 described in reference to FIG. 2D. The semiconductor device 300 and shadow mask 368 are placed in an evaporation chamber 378 with an evaporation source 380 disposed on an opposite side of the shadow mask 368 from the semiconductor device 300. The evaporation source 380 may be, for example, an electron beam crucible or a resistively-heated boat, and holds electrically conductive material 382, for example aluminum, for the electrically conductive conformal layer 358. An evaporation process is performed which heats the conductive material 382 in the evaporation source 380, so that electrically conductive material 376 is evaporated through the aperture 370 in the shadow mask 368 onto the semiconductor device 300 to form the electrically conductive conformal layer 358. The evaporation process may provide a low cost method of forming the electrically conductive conformal layer 358, which may advantageously reduce fabrication costs of the semiconductor device 300.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a semiconductor device, comprising:
    providing an integrated circuit attached to a chip carrier, the chip carrier including a substrate lead located at a front surface of the chip carrier;
    a component attached to the front surface of the chip carrier;
    an electrically insulating material disposed on the component;
    the integrated circuit comprises:
        a substrate including semiconductor material, the semiconductor material extending to a back surface of the integrated circuit;
        an interconnect region on the substrate, the interconnect region extending to a front surface of the integrated circuit;
        at least one of an NMOS transistor located within the integrated circuit or a PMOS transistor located within the integrated circuit; and
        a substrate bond pad located at the front surface of the integrated circuit; the front surface of the integrated circuit facing the front surface of the chip carrier; the substrate bond pad electrically coupled through the interconnect region to the semiconductor material; the substrate bond pad electrically coupled to the substrate lead; and
    forming an electrically conductive conformal layer disposed on the back surface of the integrated circuit, extending onto the substrate lead of the chip carrier, and extending at least partway over the electrically insulating material disposed on the component, the electrically conductive conformal layer making electrical contact with the semiconductor material in the substrate by making contact with the substrate lead.

2. The method of claim 1, wherein forming the electrically conductive conformal layer comprises forming a metal layer by a sputter process.

3. The method of claim 2, wherein forming the electrically conductive conformal layer further comprises placing a shadow mask between the semiconductor device and a sputter target, the shadow mask having an aperture exposing an area for the electrically conductive conformal layer.

4. The method of claim 2, wherein the metal layer includes a layer of aluminum having a thickness of 200 nanometers to 5 microns.

5. The method of claim 4, wherein forming the electrically conductive conformal layer further comprises forming an adhesion layer on the back surface of the integrated circuit prior to forming the layer of aluminum.

6. The method of claim 1, wherein forming the electrically conductive conformal layer comprises forming a metal layer by an evaporation process.

7. The method of claim 6, wherein forming the electrically conductive conformal layer further comprises placing a shadow mask between the semiconductor device and an evaporation source, the shadow mask having an aperture exposing an area for the electrically conductive conformal layer.

8. The method of claim 6, wherein the metal layer includes a layer of aluminum having a thickness of 200 nanometers to 5 microns.

9. The method of claim 1, wherein the electrically insulating material on the component includes organic resin.

10. The method of claim 1, further comprising dispensing an organic resin on a non-substrate lead at the front surface of the chip carrier before the step of forming the electrically conductive conformal layer, to form a lead electrically insulating material on the non-substrate lead, wherein the electrically conductive conformal layer extends at least partway over the lead electrically insulating material on the non-substrate lead, the electrically conductive conformal layer being electrically isolated from the non-substrate lead by the lead electrically insulating material.

* * * * *